(12) United States Patent
Huang

(10) Patent No.: US 10,709,029 B2
(45) Date of Patent: Jul. 7, 2020

(54) PLUG-IN DEVICE AND TERMINAL

(71) Applicant: Guangdong OPPO Mobile Telecommunications Corp., Ltd., Dongguan, Guangdong (CN)

(72) Inventor: Hanjie Huang, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/654,663

(22) Filed: Oct. 16, 2019

(65) Prior Publication Data

US 2020/0053894 A1 Feb. 13, 2020

Related U.S. Application Data

(63) Continuation of application No. PCT/CN2017/081155, filed on Apr. 19, 2017.

(51) Int. Cl.
*H05K 5/02* (2006.01)
*H04B 1/3818* (2015.01)
(Continued)

(52) U.S. Cl.
CPC ......... *H05K 5/0291* (2013.01); *H01R 12/714* (2013.01); *H04B 1/3818* (2015.01); *H04M 1/026* (2013.01)

(58) Field of Classification Search
CPC .. H05K 5/0291; H04B 1/3818; H01R 12/714; H04M 1/026
See application file for complete search history.

(56) References Cited

U.S. PATENT DOCUMENTS 8,737,088 B2 * 5/2014 Chang ................. G06K 7/0039
361/737
8,824,130 B2 * 9/2014 Chang ................. G06K 7/0039
235/441
(Continued)

FOREIGN PATENT DOCUMENTS

CN 203747075 U * 7/2014
CN 203747075 U 7/2014
(Continued)

OTHER PUBLICATIONS

International search report issued in corresponding international application No. PCT/CN2017/081155 dated Dec. 29, 2017.
(Continued)

*Primary Examiner* — Abdullah A Riyami
*Assistant Examiner* — Nader J Alhawamdeh
(74) *Attorney, Agent, or Firm* — Young Basile Hanlon & MacFarlane, P.C.

(57) ABSTRACT

A plug-in device may include a circuit board, a first connecting piece stacked on the circuit board and a card tray stacked on the first connecting piece. The card tray may include a first mounting face facing the first connecting piece and a second mounting face away from the first connecting piece. The first mounting face may be configured to place a first chip card electrically connected to the circuit board through the first connecting piece. The second mounting face may be configured to place a second chip card electrically connected to the circuit board. A projection of the first mounting face along a direction perpendicular to the first mounting face may overlap that of the second mounting face. A terminal may include the above mentioned plug-in device.

16 Claims, 4 Drawing Sheets

(51) Int. Cl.
*H01R 12/71* (2011.01)
*H04M 1/02* (2006.01)

(56) References Cited

U.S. PATENT DOCUMENTS

| | | | | |
|---|---|---|---|---|
| 2004/0014496 | A1* | 1/2004 | Chen | H04B 1/3816 |
| | | | | 455/558 |
| 2011/0141709 | A1* | 6/2011 | Wang | H04B 1/3816 |
| | | | | 361/759 |
| 2013/0235532 | A1 | 9/2013 | Chang | |
| 2013/0235548 | A1* | 9/2013 | Chang | G06K 7/0039 |
| | | | | 361/810 |

FOREIGN PATENT DOCUMENTS

| | | |
|---|---|---|
| CN | 104702733 A | 6/2015 |
| CN | 205595485 U | 9/2016 |

OTHER PUBLICATIONS

European search report, EP17906101 dated Jan. 20, 2020 (6 pages).

\* cited by examiner

PLUG-IN DEVICE AND TERMINAL

CROSS-REFERENCE TO RELATED APPLICATION(S)

The present application is a continuation application of International (PCT) Patent Application No. PCT/CN2017/081155 filed on Apr. 19, 2017, the entire contents of which are hereby incorporated by reference in their entireties.

TECHNICAL FIELD

The described embodiments relate to an electronic apparatus field, and more particularly, to a plug-in device and a terminal.

BACKGROUND

As one of the important technologies in the world today, a terminal has been integrated into people's lives and become an indispensable part of daily life and work. The terminal may implement the functions of calling, storing personal information, image and video, and the like, by placing a chip card such as a SIM card, a TF card or a MICROSD card. In the related art, two chip cards may be placed on the same side of the card tray of a terminal. The structure makes the length of the card tray large, which is disadvantageous for miniaturization of the structure connected to the card tray.

SUMMARY

A plug-in device in accordance with an embodiment in the present disclosure may include a circuit board, a first connecting piece, and a card tray; the circuit board may have a support face; the first connecting piece may be arranged on the support face, and has a first contact terminal; the first contact terminal may be electrically coupled to the circuit board; the card tray may include a first mounting face facing the first connecting piece and a second mounting face; the first mounting face is arranged on a side of the card tray, and the second mounting face is arranged on an opposite side of the card tray, the first mounting face and the second mounting face are arranged along a thickness direction of the card tray; the first mounting face may be configured to place a first chip card in electrical contact with the first contact terminal; and the second mounting face may be configured to place a second chip card electrically coupled to the circuit board.

A plug-in device in accordance with an embodiment in the present disclosure may include a circuit board, a first connecting piece stacked on the circuit board and a card tray stacked on the first connecting piece. The card tray may include a first mounting face facing the first connecting piece and a second mounting face away from the first connecting piece. The first mounting face may be configured to place a first chip card electrically connected to the circuit board through the first connecting piece. The second mounting face may be configured to place a second chip card electrically connected to the circuit board. A projection of the first mounting face along a direction perpendicular to the first mounting face may overlap that of the second mounting face.

A terminal in accordance with an embodiment in the present disclosure includes the plug-in device of the above-mentioned embodiment.

Additional aspects and advantages of embodiments of present disclosure will be given in part in the following descriptions, become apparent in part from the following descriptions, or be learned from the practice of the embodiments of the present disclosure.

BRIEF DESCRIPTION OF DRAWINGS

The above and/or additional aspects and advantages of the present disclosure may become apparent and readily understood from the description of the embodiments of the disclosure.

DETAILED DESCRIPTION

Figure 1:
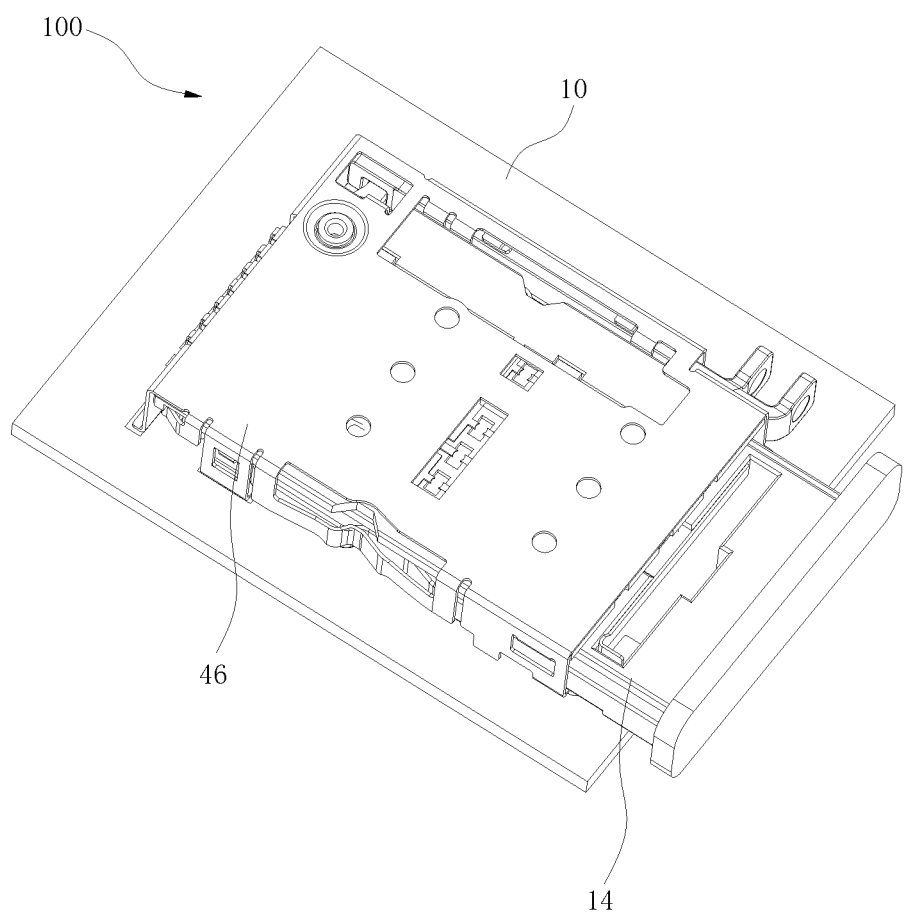
FIG. 1 is an isometric view of a plug-in device in accordance with an embodiment in the present disclosure.

The embodiments of the present disclosure are described in detail below, and the examples of the embodiments are illustrated in the drawings, wherein the same or similar reference numerals are used to refer to the same or similar elements or elements having the same or similar functions. The embodiments described below with reference to the accompanying drawings are intended to be illustrative only, and are not to be construed as limiting.

In the description of the present disclosure, it is to be understood that terms such as "center", "longitudinal", "lateral", "length", "width", "thickness", "upper", "lower", "front", "rear", "left", "right", "vertical", "horizontal", "top", "bottom", "inner", "outer", "clockwise", "counterclockwise", and the like, refer to the orientations and locational relations illustrated in the accompanying drawings. Thus, these terms used here are only for describing the present disclosure and for describing in a simple manner, and are not intended to indicate or imply that the device or the elements are disposed to locate at the specific directions or are structured and performed in the specific directions, which could not to be understood as limiting the present disclosure. In addition, terms such as "first" and "second" are used herein for purposes of description and are not intended to indicate or imply relative importance or significance or to imply the number of indicated technical features. Thus, the feature defined with "first" and "second" may include one or more of such a feature. In the description of the present disclosure, "a plurality of" means two or more than two, unless specified otherwise.

In the present disclosure, unless specified or limited, otherwise, terms "installed", "connected", "coupled", and the like are used in a broad sense, and may include, for example, fixed connections, detachable connections, or integral connections; may also be mechanical or electrical connections; may also be direct connections or indirect connections via intervening structures; may also be inner communications of two elements, as can be understood by one skilled in the art depending on specific contexts.

In the present disclosure, the first feature "on" or "under" the second feature may include direct contact of the first and second features, and may also include that the first and second features are not in direct contact but are contacted by additional features between them. It is not in direct contact but through additional features between them. Moreover, the first feature "above", "upper" and "superjacent" the second feature includes the first feature directly above and skew above the second feature, or merely indicating that the first feature level is higher than the second feature. The first feature "below", and "lower" the second feature includes the first feature directly below and skew below the second feature, or merely the first feature level is less than the second feature.

The following disclosure provides many different embodiments or examples for implementing different structures of the present disclosure. In order to simplify the disclosure of the present disclosure, the components and arrangements of the specific examples are described below. Of course, they are merely examples and are not intended to limit the disclosure. In addition, the present disclosure may be repeated with reference to the numerals and/or reference numerals in the various examples, which are for the purpose of simplicity and clarity, and do not indicate the relationship between the various embodiments and/or arrangements discussed. Moreover, the present disclosure provides examples of various specific processes and materials, but one of ordinary skill in the art will recognize the use of other processes and/or the use of other materials.

According to an aspect of the present disclosure, a plug-in device may be provided. The plug-in device may include a circuit board, a first connecting piece, and a card tray; the circuit board may have a support face; the first connecting piece may be arranged on the support face, and has a first contact terminal; the first contact terminal may be electrically coupled to the circuit board; the card tray may include a first mounting face facing the first connecting piece and a second mounting face; the first mounting face is arranged on a side of the card tray, and the second mounting face is arranged on an opposite side of the card tray, the first mounting face and the second mounting face are arranged along a thickness direction of the card tray; the first mounting face may be configured to place a first chip card in electrical contact with the first contact terminal; and the second mounting face may be configured to place a second chip card electrically coupled to the circuit board.

According to an aspect of the present disclosure, a plug-in device may be provided. The plug-in device may include a circuit board, a first connecting piece, and a card tray; the circuit board may have a support face; the first connecting piece may be arranged on the support face, and has a first contact terminal; the first contact terminal may be electrically coupled to the circuit board; the card tray may include a first mounting face facing the first connecting piece and a second mounting face; the first mounting face and the second mounting face are respectively arranged on opposite sides in a thickness direction of the card tray; the first mounting face may be configured to place a first chip card in electrical contact with the first contact terminal; and the second mounting face may be configured to place a second chip card electrically coupled to the circuit board.

In some embodiments, the first contact terminal may be a first elastic piece protruding toward the first mounting face, and the first elastic piece may be configured to elastically abut against the first chip card.

In some embodiments, the first mounting face and the second mounting face may be stacked together.

In some embodiments, the card tray may define a first containing groove configured to contain the first chip card and a second containing groove configured to contain the second chip card; an opening of the first containing groove may be opposite to an opening of the second containing groove; the first mounting face may be a bottom face of the first containing groove, and the second mounting face may be a bottom face of the second containing groove.

In some embodiments, the card tray may define a first containing groove configured to contain the first chip card and a second containing groove configured to contain the second chip card; the first containing groove and the second containing groove are respectively arranged on opposite sides in the thickness direction of the card tray; the first mounting face may be a bottom face of the first containing groove, and the second mounting face may be a bottom face of the second containing groove.

In some embodiments, a through hole penetrating the first mounting face and the second mounting face may be defined in the card tray.

In some embodiments, the card tray may include a main body having a substantially rectangular shape; the main body may include the first mounting face and the second mounting face; a tray cap may be arranged on one end of the main body along a longitudinal direction of the main body; and a periphery of the tray cap may protrude from the main body.

In some embodiments, the plug-in device may include a second connecting piece located above the second mounting face; the second connecting piece may be provided with a second contact terminal; the second contact terminal may be electrically coupled to the circuit board, and the second contact terminal may be configured to electrically contact the second chip card.

In some embodiments, the second contact terminal may be a second elastic piece protruding toward the second mounting face, and the second elastic piece may be configured to elastically abut against the second chip card.

In some embodiments, the second connecting piece may be provided with a pin electrically coupled to the second contact terminal, and the pin may be fixed on the circuit board to electrically contact the second contact terminal with the circuit board.

In some embodiments, the plug-in device may include a housing fixed on the circuit board; the card tray may be arranged in the housing; and the second connecting piece may be fixedly coupled to the housing.

In some embodiments, a side face of the card tray may be provided with a first limiting portion; the housing may be provided with a second limiting portion; and the first limiting portion may match with the second limiting portion to limit relative movement of the card tray and the housing.

In some embodiments, the first limiting portion may be a groove; an elastic piece extending along a direction in which the card tray is plugged in or pulled out the housing may be provided on the housing; the second limiting portion may be a protrusion formed on the elastic piece; and the protrusion may be engaged in the groove.

In some embodiments, the first limiting portion may be a groove; the housing may include an elastic piece arranged along a direction in which the card tray is plugged in or pulled out the housing.

In some embodiments, the elastic piece may include a connecting portion connected to the housing and a bending portion connected to the connecting portion, the protrusion may be the bending portion.

In some embodiments, the protrusion may be formed by bending the elastic piece.

In some embodiments, a projection of the first mounting face on a reference plane and a projection of the second mounting face on the reference plane may be unoverlapped, the reference plane may be a plane parallel to the support face.

In some embodiments, the circuit board may be provided with a pad, and the pin may be soldered to the pad.

According to another aspect of the present disclosure, a plug-in device may be provided. The plug-in device may include a circuit board, a first connecting piece stacked on the circuit board and a card tray stacked on the first connecting piece. The card tray may include a first mounting face facing the first connecting piece and a second mounting face away from the first connecting piece. The first mounting face may be configured to place a first chip card electrically connected to the circuit board through the first connecting piece. The second mounting face may be configured to place a second chip card electrically connected to the circuit board. A projection of the first mounting face along a direction perpendicular to the first mounting face may overlap that of the second mounting face.

In some embodiments, the plug-in device may include a second connecting piece stacked on the card tray; the second connecting piece may include a pin electrically connected to the circuit board such that the second chip card is connected to the circuit board.

According to another aspect of the present disclosure, a terminal may be provided. The terminal may include a shell defining a recess in a side of the shell, a screen embedded in the shell and a plug-in device received in the recess. The plug-in device may include a circuit board, a connecting piece stacked on the circuit board and a card tray stacked on the first connecting piece. The card tray may include a first mounting face facing the connecting piece and a second mounting face away from the connecting piece; the first mounting face may be configured to place a first chip card electrically connected to the circuit board through the first connecting piece; the second mounting face may be configured to place a second chip card electrically connected to the circuit board.

In some embodiments, a projection of the first mounting face along a direction perpendicular to the first mounting face may overlap that of the second mounting face.

In some embodiments, an outer face of the card tray may be flush with an outer face of the shell.

Figure 2:
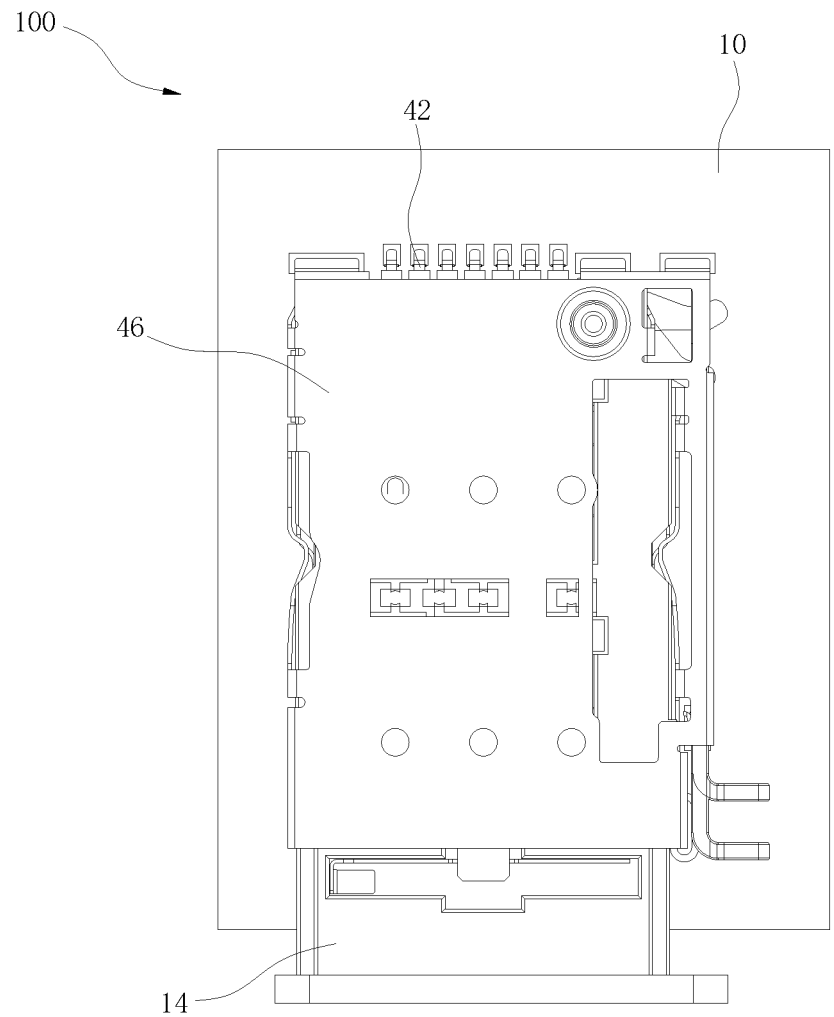
FIG. 2 is a plane view of a plug-in device in accordance with an embodiment in the present disclosure.
Figure 3:
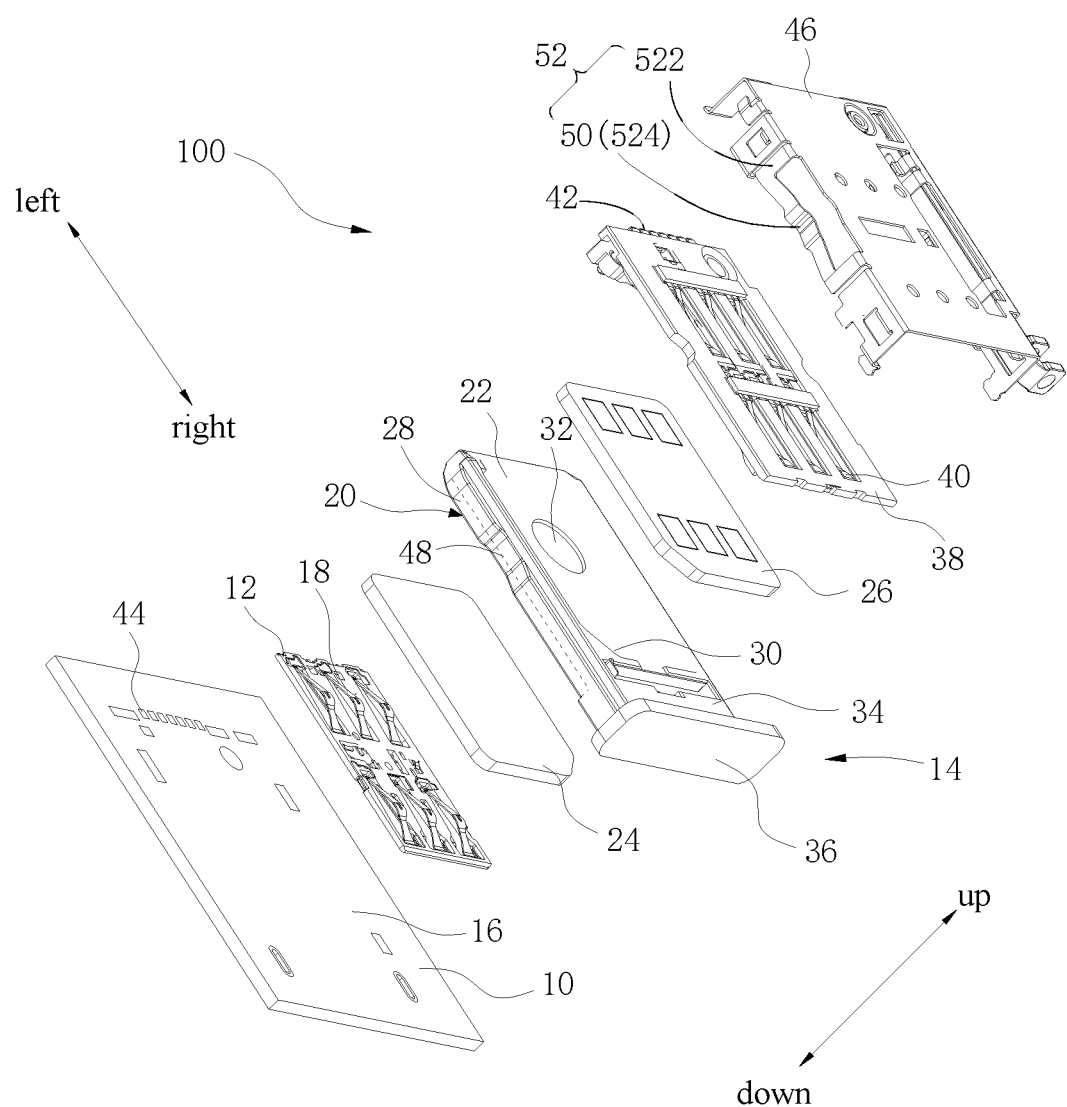
FIG. 3 is an explored view of a plug-in device in accordance with an embodiment in the present disclosure.

Referring to FIGS. 1 to 3, a plug-in device 100 in accordance with an embodiment in the present disclosure may include a circuit board 10, a first connecting piece 12, and a card tray 14. The circuit board 10 may include a support face 16.

The first connecting piece 12 may be arranged on the support face 16. The first connecting piece 12 may be provided with a first contact terminal 18. The first contact terminal 18 may be electrically coupled to the circuit board 10.

The card tray 14 may include a first mounting face 20 and a second mounting face 22. The first mounting face 20 and the second mounting face 22 may be respectively arranged on opposite sides in a thickness direction of the card tray 14. That is, the first mounting face 20 may be arranged on a side of the card tray 14, and the second mounting face 22 may be arranged on an opposite side of the card tray 14. The first mounting face 20 and the second mounting face 22 may be arranged along the thickness direction of the card tray 14. The first mounting face 20 may be arranged facing the first connecting piece 12. The first mounting face 20 may be configured to place a first chip card 24 in electrical contact with the first contact terminal 18. The second mounting face 22 may be configured to place a second chip card 26 electrically coupled to the circuit board 10.

In the plug-in device 100 in accordance with an embodiment in the present disclosure, each of the two opposite sides of the card tray 14 could receive a chip card, which may be advantageous for reducing the size of the card tray 14. In addition, the first connecting piece 12 is arranged on the circuit board 10, so that the structure of the plug-in device 100 could be compact, which could facilitate miniaturization of the plug-in device 100.

Specifically, the thickness direction of the card tray 14 may be, for example, an up-down direction shown in FIG. 3, i.e., in this embodiment, the first mounting face 20 may be located on a lower side of the card tray 14 and the second mounting face 22 may be located on an upper side of the card tray 14.

In this embodiment, the circuit board 10 may be a printed circuit board having a high rigidity. The card tray 14 may be made of a metal material such as stainless steel, which could ensure that the card tray 14 has better rigidity and ductility, thereby making the card tray 14 further thinner and lighter.

Figure 4:
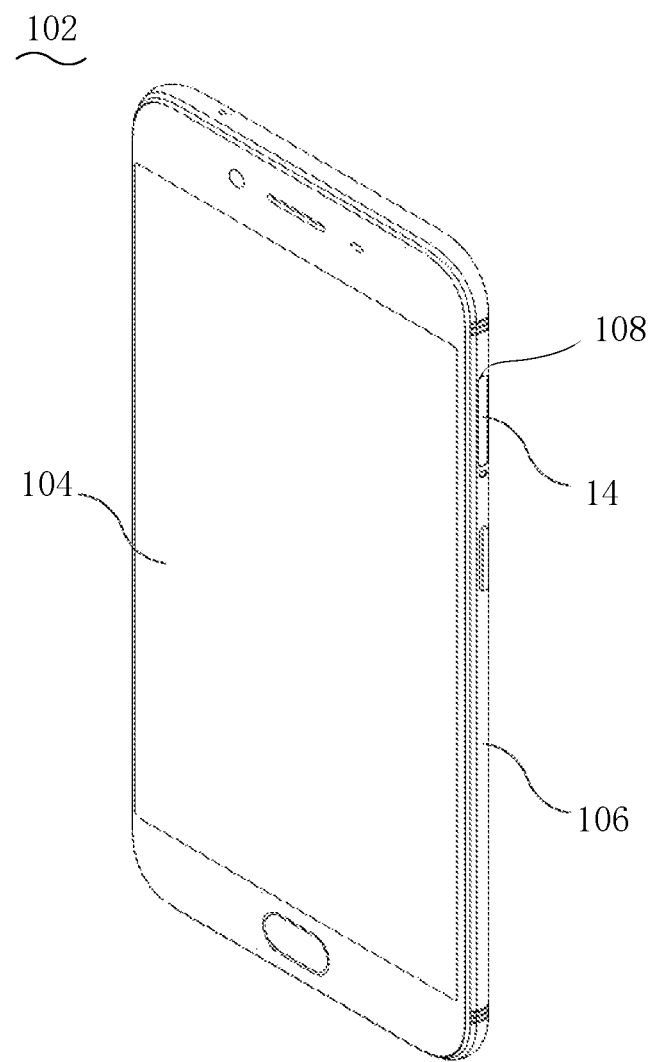
FIG. 4 is an isometric view of a terminal in accordance with an embodiment in the present disclosure.

Both the first chip card 24 and the second chip card 26 may include, but not limited to, a subscriber identity module card (SIM card), a trans flash card (TF card), or a secure digital card (SD card). The chip card may perform data transmission with a terminal 102 through the circuit board 10, so that the terminal 102 could read the information in the chip card to implement corresponding functions or store data to the chip card, as shown in FIG. 4. For example, the terminal 102 may implement the functions of calling, transmitting or receiving information by reading the information in the chip card.

In some embodiments, the first contact terminal 18 may be a first elastic piece protruding toward the first mounting face 20. The first elastic piece may be configured to elastically abut against the first chip card 24.

As a result, the first elastic piece could avoid affecting the data transmission function between the first chip card 24 and the circuit board 10, which is resulted by the badly contacting between the first contact terminal 18 and the first chip card 24.

It may be understood that, the first contact terminal 18 may be made of a conductive material such as metal, for example, the first contact terminal 18 may be made of copper. In order to facilitate the formation of the first connecting piece 12, the first connecting piece 12 and the first contact terminal 18 may be formed of a single piece.

In some embodiments, the first mounting face 20 and the second mounting face 22 may be stacked together. For example, a projection of the first mounting face 20 on a reference plane and a projection of the second mounting face 22 on the reference plane may be overlapped. The reference plane is a plane parallel to the support face 16. As a result, the size of the card tray 14 could be reduced, and the plug-in device 100 could be miniaturized. It may be understood that the first mounting face 20 and the second mounting face 22 may be arranged stacked together so that the first chip card 24 and the second chip card 26 could also be stacked together on the card tray 14.

Of course, in some embodiments, the first mounting face 20 and the second mounting face 22 may be staggered from each other. That is, the projection of the first mounting face 20 on the reference plane and the projection of the second mounting face 22 on the reference plane may not be overlapped. For example, the first mounting face 20 and the second mounting face 22 may be arranged offset in a longitudinal direction of the card tray 14. The longitudinal direction of the card tray 14 may be, for example, a left-right direction shown in FIG. 3

In some embodiments, the card tray 14 may define a first containing groove 28 and a second containing groove 30.

The first containing groove 28 may be configured to contain the first chip card 24. The second containing groove 30 may be configured to contain the second chip card 26. The first containing groove 28 and the second containing groove 30 may be respectively defined on opposite sides in the thickness direction of the card tray 14. For example, an opening of the first containing groove 28 may be opposite to an opening of the second containing groove 30. The first mounting face 20 may be a bottom face of the first containing groove 28. The second mounting face 22 may be a bottom face of the second containing groove 30.

As a result, the chip card could be placed in the containing groove. The position of the chip card may be restricted, so that the chip card may be quickly installed into a predetermined position. Moreover, the thickness of the card tray 14 could also be reduced.

The shape and size of the containing groove may match the shape and size of the chip card. Taking the first containing groove 28 and the first chip card 24 as an example, for example, the shape of the first containing groove 28 may be the same as that of the first chip card 24. The first chip card 24 such as a SIM card, a TF card, or an SD card, may have a rectangular or polygonal shape. Therefore, the shape of the first containing groove 28 may be a rectangle or a polygon. In addition, it may be understood that the size of the first containing groove 28 may be slightly larger than the size of the first chip card 24, so that the first chip card 24 could be installed into the first containing groove 28.

In some embodiments, a through hole 32 penetrating the first mounting face 20 and the second mounting face 22 may be defined in the card tray 14.

The through hole 32 may facilitate a user to remove the chip card from the card tray 14. For example, after a user removes one of the two chip cards, the user may use his finger or other object to pass through the through hole 32, to push the other chip card out, therefore the two chip cards could be removed from the card tray 14. In addition, the through hole 32 may also reduce a contact area between the chip card and the card tray 14, thereby facilitating heat dissipation of the chip card.

In some embodiments, the card tray 14 may include a substantially rectangular cubic main body 34. The main body 34 may include the first mounting face 20 and the second mounting face 22. The first mounting face 20 may be a face of the main body 34, and the second mounting face 22 may be another face of the main body 34. A tray cap 36 may be arranged on one end of the main body 34 along a longitudinal direction of the main body 34. A periphery of the tray cap 36 may protrude from the main body 34.

Therefore, the tray cap 36 could facilitate a user to catch the card tray 14 to install the card tray 14 into the terminal 102. After the card tray 14 is installed into the terminal 102, the tray cap 36 may match with a recess 108 of the terminal 102, such that an outer face of the tray cap 36 may flush with a side face of the terminal 102, forming a smooth surface and providing a better appearance.

A shape of the tray cap 36 may be designed according to actual conditions, for example, a shape of a square, a circle, an ellipse, an oval, or the like.

It should be noted that, the longitudinal direction of the main body 34 is, for example, a left-right direction shown in FIG. 3. The card tray 14 may be installed into and removed from the terminal 102 along the longitudinal direction of the main body 34.

In some embodiments, the plug-in device 100 may include a second connecting piece 38. The second connecting piece 38 may be located above the second mounting face 22. The second connecting piece 38 may be provided with a second contact terminal 40. The second contact terminal 40 may be electrically coupled to the circuit board 10. The second contact terminal 40 may be configured to electrically contact the second chip card 26.

Therefore the connecting piece 38 may simplify an electrical connection between the second chip card 26 and the circuit board 10, to make the plug-in device 100 more compact.

It may be understood that, the second contact terminal 40 may be made of a conductive material such as metal, for example, the second contact terminal 40 may be made of copper. In order to facilitate the formation of the second connecting piece 38, the second connecting piece 38 and the second contact terminal 40 may be formed of a single piece.

In some embodiments, the second contact terminal 40 may be a second elastic piece protruding toward the second mounting face 22. The second elastic piece may be configured to elastically abut against the second chip card 26.

The second elastic piece is configured to elastically abut against the second chip card 26, so as to avoid affecting the data transmission function between the second chip card 26 and the circuit board 10, which is resulted by the badly contacting between the second chip card 26 and the second contact terminal 40.

In some embodiments, the second connecting piece 38 may be provided with a pin 42. The pin 42 may be electrically coupled to the second contact terminal 40. The pin 42 may be fixed on the circuit board 10 to electrically contact the second contact terminal 40 to the circuit board 10.

The second connecting piece 38 may be fixed on the circuit board 10 through the pin 42. For example, the circuit board 10 may be provided with a pad 44, and the pin 42 may be soldered to the pad 44 on the circuit board 10.

The pin 42 and the second contact terminal 40 may be coupled together by wires to implement an electrical connection.

In some embodiments, the plug-in device 100 may include a housing 46 fixed on the circuit board 10. The card tray 14 may be arranged in the housing 46. The second connecting piece 38 may be fixedly coupled to the housing 46.

Thus, the housing 46 may increase rigidity of the second connecting piece 38, to prevent the second connecting piece 38 from deforming and losing its function, thereby normal contact between the second connecting piece 38 and the second chip card 26 could be ensured.

In an example, when the plug-in device 100 is assembled, the second connecting piece 38 may be first fixed on the housing 46, and then the housing 46 with the second connecting piece 38 may be soldered to the circuit board 10 with the first connecting piece 12 arranged thereon, and furthermore, the second connecting piece 38 may be also fixed on the circuit board 10 through the pin 42.

In some embodiments, a side face of the card tray 14 may be provided with a first limiting portion 48. The housing 46 forms a second limiting portion 50. The first limiting portion 48 may match with the second limiting portion 50 to limit relative movement of the card tray 14 and the housing 46.

The first limiting portion 48 and the second limiting portion 50 are coupled to each other to prevent the card tray 14 from separating from the housing 46, such that the connection between the chip card and the connecting piece may not be affected, as a result, affecting the electrical connection between the chip card and the circuit board 10 could be avoided.

In some embodiments, the first limiting portion 48 may be a groove. An elastic piece 52 extending along a direction in which the card tray 14 is plugged in or pulled out the housing 46 may be provided on a side of the housing 46. The second limiting portion 50 may be a protrusion formed on the elastic piece 52. The protrusion may be engaged in the groove.

The first limiting portion 48 and the second limiting portion 50 have a simple structure which could facilitate the manufacture of the plug-in device 100. It should be noted that, the direction in which the card tray 14 is plugged in or pulled out the housing 46 is, for example, a left-right direction shown in FIG. 3.

In some embodiments, the protrusion on the elastic piece 52 may be formed by bending the elastic piece 52. The elastic piece 52 may include a connecting portion 522 connected to the housing 46 and a bending portion 524 connected to the connecting portion 522. The protrusion is the bending portion 524. Thus the second limiting portion 50 may be easily formed.

Referring to FIG. 4, a terminal 102 in accordance with an embodiment in the present disclosure, may include a plug-in device 100 according to any one of the above-mentioned embodiments.

In the terminal 102 in accordance with an embodiment in the present disclosure, each of two opposite sides of the card tray 14 could be configured to mount a chip card, which may be advantageous for reducing the size of the card tray 14. In addition, the first connecting piece 12 may be arranged on the circuit board 10, so that the structure of the plug-in device 100 could be compact, which could facilitate miniaturization of the plug-in device 100.

In an embodiment of the present disclosure, the terminal 102 may be various devices configured to acquire data from outside and process the data, or the terminal 102 may be various devices that have a built-in battery and are configured to acquire current from outside to charge the battery, for example, mobile phones, tablets, computing devices, or information display devices.

The terminal 102 adopted in the present disclosure will be described by taking a mobile phone as an example. In an embodiment of the present disclosure, the mobile phone may include a radio frequency circuit, a memory, an input unit, a wireless fidelity (Wi-Fi) module, a display unit 104 (such as, a screen), a shell 106, a sensor, an audio circuit, a processor, a projection unit, a shooting unit, a battery, a card tray, and the like. The card tray may be placed on a side of the mobile phone.

The radio frequency circuit may be configured to receive and send signals during receiving and sending information or a call. In particular, after receiving downlink data from a base station, the radio frequency circuit may transmit the data to the processor to process. In addition, the radio frequency circuit may send uplink data of the mobile phone to the base station. Generally, the radio frequency circuit may include, but not limited to, an antenna, at least one amplifier, a transceiver, a coupler, a low noise amplifier, a duplexer, and the like. In addition, the radio frequency circuit may communicate with a network and other devices through wireless communication. The above-mentioned wireless communication may use any communication standard or protocol, including but not limited to a global system for mobile communication (GSM), a general packet radio service (GPRS), a code division multiple access (CDMA), a wideband code division multiple access (WCDMA), a long term evolution (LTE), an e-mail, short messaging service (SMS), and the like.

The memory may be configured to store software programs and modules. The processor executes various functional applications and data processing of the mobile phone by running software programs and modules stored in the memory. The memory may mainly include a storage program area and a storage data area. The storage program area may store an operating system, at least one application required by a function (such as a sound playing function, an image playing function, and the like). The storage data area may store data created according to a user of the mobile phone (such as audio data, a phone book, and the like). In addition, the memory may include a high speed random access memory, and may also include a nonvolatile memory, such as at least one of a magnetic disk storage device, a flash memory device, or other volatile solid state storage device.

The input unit may be configured to receive input numeric or character information, and generate key signals related to user settings and function controls of a mobile phone. Specifically, the input unit may include a touch panel and other input devices. The touch panel, also referred to as a touch screen, may acquire touch operations on or near the touch panel by a user (such as operations on or near the touch panel by a user using a finger, a stylus, any suitable object or accessory, or the like), and corresponding connecting devices are driven according to a preset program. Optionally, the touch panel may include two parts, a touch detection device and a touch controller. The touch detection device detects a touch orientation of a user, and detects a signal brought by a touch operation, and sends the signal to the touch controller. The touch controller may be configured to receive the touch signal from the touch detection device, convert the touch signal into contact coordinates, send the touch signal to the processor, and further receive commands from the processor and execute them. In addition, the touch panel may be implemented in various types such as resistive, tray capacitive, infrared, and surface acoustic waves. In addition to the touch panel, the input unit may also include other input devices. Specifically, the other input devices may include, but not limited to, one or more of a physical keyboard, a function key (such as volume control buttons, switch buttons, and the like), a trackball, a mouse, a joystick, and the like.

The display unit 104 may be configured to display information input by a user or information provided to a user and various menus of the mobile phone. The display unit 104 may include a display panel. Optionally, the display panel may be configured in a form of a liquid crystal display (LCD), an organic light-emitting diode (OLED), and the like. Further, the touch panel may cover the display panel. When the touch panel detects a touch operation on or near the touch panel, the touch panel sends the detecting result to the processor to determine what type of touch event. The processor then provides a corresponding visual output on the display panel based on the type of touch event.

A position of the visual output in the display panel that may be recognized by the human eye may be referred to as a "display area" in the following descriptions. In some embodiments, the touch panel and the display panel may be used as two independent components to realize input and output functions of the mobile phone. In other embodiments, the touch panel and the display panel may be integrated to realize the input and output functions of the mobile phone.

In addition, the mobile phone may also include at least one type of sensor, such as an attitude sensor, a light sensor, and other sensors.

Specifically, the attitude sensor may also be referred to as a motion sensor, and as one type of the motion sensor, a gravity sensor may be cited. The gravity sensor may be made of a flexible sensor and may be made of a cantilever type shifter, and adopts an energy storage spring made of elastic sensitive components to drive electrical contacts. Thereby, a conversion from gravity changing to electrical signals changing, may be realized.

As another type of a motion sensor, an accelerometer sensor may be cited. The accelerometer sensor may detect the acceleration of each directions (usually directions of three axes), and may detect the magnitude and a direction of gravity when the mobile phone is at rest. The accelerometer sensor may be used to identify the gesture of the mobile phone (such as horizontal and vertical screen switching, related games, magnetometer attitude calibration), and detect vibration recognition related functions (such as pedometer, and tapping).

In some embodiments of the present disclosure, the motion sensor listed above may be used as an "attitude parameter" element to be described later, but may be not limited thereto. Other sensors configured to acquire the "attitude parameter" are contained in the protection scope of the present disclosure. For example, a gyroscope or the like, and the working principle and data processing procedure of the gyroscope may be similar to the related art, therefore no additional description is given herein.

In addition, in some embodiment of the present disclosure, as sensors, other sensors such as a barometer, a hygrometer, a thermometer, and an infrared sensor may be arranged, no additional description may be given herein.

A light sensor may include an ambient light sensor and a proximity sensor. The ambient light sensor may adjust the brightness of the display panel according to the brightness of the ambient light. The proximity sensor may turn off the display panel and/or the backlight when the mobile phone moves to the ear.

An audio circuit, a loudspeaker, and a microphone provide audio interfaces between a user and a mobile phone. The audio circuit may be configured to convert the received audio data to an electrical signal, and transmit to the loudspeaker. The loudspeaker may convert the electrical signal to a sound signal. On the other hand, the microphone may be configured to convert the acquired sound signal into an electrical signal. The electrical signal may be received by the audio circuit and converted into audio data by the audio circuit. The audio data may be then output to the processor, processed by the processor, and sent via a radio frequency circuit to, for example, another mobile phone, or the audio data may be output to a memory for further processing.

Wi-Fi is a short-range wireless transmission technology. A mobile phone may help a user to send and receive emails, browse web pages and access streaming media through a Wi-Fi module. It provides users with wireless broadband internet access.

A processor may be a control center of a mobile phone. The processor connects various parts of an entire mobile phone by various interfaces and lines. The processor executes functions of the mobile phone and processing data by running or executing software programs stored in the memory and/or modules, and calling data stored in the memory, so as to monitor the mobile phone as a whole. Optionally, the processor may include one or more processing units. Preferably, the processor may integrate an application processor and a modem processor. The application processor mainly processes an operating system, a user interface, an application, and the like. The modem processor mainly handles wireless communications.

It may be understood that, the above-mentioned modem processor may not be integrated into the processor.

In the description of the present disclosure, the description with reference to the terms "one embodiment", "some embodiments", "illustrative embodiment", "example", "specific example", "some examples", and the like, may refer to specific features, structures, materials, or characteristics described in the embodiments or examples included in at least one embodiment or example of the disclosure. In the present disclosure, the schematic representation of the above terms may not necessarily mean the same embodiment or example. Furthermore, particular features, structures, materials, or characteristics described may be combined in a suitable manner in any one or more embodiments or examples.

Although embodiments of the present disclosure have been shown and described, it will be understood by those of ordinary skill in the art: the various modifications, changes, substitutions and transforms of the embodiments may be made without departing from the spirit and scope of the present disclosure. The scope of the present disclosure is defined by the claims and their equivalents.

What is claimed is:

1. A plug-in device, comprising:
   a circuit board having a support face;
   a first connecting piece arranged on the support face, and provided with a first contact terminal, wherein the first contact terminal is electrically coupled to the circuit board;
   a card tray comprising a first mounting face facing the first connecting piece and a second mounting face; wherein the first mounting face is arranged on a side of the card tray, and the second mounting face is arranged on an opposite side of the card tray, the first mounting face and the second mounting face are arranged along a thickness direction of the card tray, the first mounting face is configured to place a first chip card in electrical contact with the first contact terminal, and the second mounting face is configured to place a second chip card electrically coupled to the circuit board;
   a second connecting piece located above the second mounting face; wherein the second connecting piece is provided with a second contact terminal; the second contact terminal is electrically coupled to the circuit board, and the second contact terminal is configured to electrically contact the second chip card; and
   a housing fixed on the circuit board; the card tray is arranged in the housing; and the second connecting piece is fixedly coupled to the housing;
   wherein a side face of the card tray is provided with a first limiting portion; the housing is provided with a second limiting portion; and the first limiting portion matches with the second limiting portion to limit relative movement of the card tray and the housing;
   the first limiting portion is a groove; an elastic piece extending along a direction in which the card tray is plugged in or pulled out the housing is provided on the housing; the second limiting portion is a protrusion formed on the elastic piece; and the protrusion is engaged in the groove.

2. The plug-in device according to claim 1, wherein the first contact terminal is a first elastic piece protruding toward the first mounting face, and the first elastic piece is configured to elastically abut against the first chip card.

3. The plug-in device according to claim 1, wherein the first mounting face and the second mounting face are stacked together.

4. The plug-in device according to claim 1, wherein the card tray defines a first containing groove configured to contain the first chip card and a second containing groove configured to contain the second chip card; an opening of the first containing groove is opposite to an opening of the second containing groove; and the first mounting face is a bottom face of the first containing groove, and the second mounting face is a bottom face of the second containing groove.

5. The plug-in device according to claim 1, wherein a through hole penetrating the first mounting face and the second mounting face is defined in the card tray.

6. The plug-in device according to claim 1, wherein the card tray comprises a main body having a substantially rectangular shape; the main body comprises the first mounting face and the second mounting face; a tray cap is arranged on one end of the main body along a longitudinal direction of the main body; and a periphery of the tray cap protrudes from the main body.

7. The plug-in device according to claim 1, wherein the second contact terminal is a second elastic piece protruding toward the second mounting face, and the second elastic piece is configured to elastically abut against the second chip card.

8. The plug-in device according to claim 1, wherein the second connecting piece is provided with a pin electrically coupled to the second contact terminal, and the pin is fixed on the circuit board to electrically contact the second contact terminal with the circuit board.

9. The plug-in device according to claim 1, wherein the elastic piece comprises a connecting portion connected to the housing and a bending portion connected to the connecting portion, the protrusion is the bending portion.

10. The plug-in device according to claim 1, wherein a projection of the first mounting face on a reference plane and a projection of the second mounting face on the reference plane are unoverlapped, the reference plane is a plane parallel to the support face.

11. The plug-in device according to claim 8, wherein the circuit board is provided with a pad, and the pin is soldered to the pad.

12. A plug-in device, comprising:
a circuit board,
a first connecting piece stacked on the circuit board; and
a card tray stacked on the first connecting piece, wherein the card tray comprises a first mounting face facing the first connecting piece and a second mounting face away from the first connecting piece, a side face of the card tray is provided with a groove; the first mounting face is configured to place a first chip card electrically connected to the circuit board through the first connecting piece; the second mounting face is configured to place a second chip card electrically connected to the circuit board; wherein a projection of the first mounting face along a direction perpendicular to the first mounting face overlaps that of the second mounting face; and
a housing fixed on the circuit board; wherein the card tray is arranged in the housing; an elastic piece extending along a direction in which the card tray is plugged in or pulled out the housing is provided on the housing, a protrusion is formed on the elastic piece;
wherein the protrusion is engaged in the groove to limit relative movement of the card tray and the housing.

13. The plug-in device according to claim 12, further comprises a second connecting piece stacked on the card tray, wherein the second connecting piece comprises a pin electrically connected to the circuit board such that the second chip card is connected to the circuit board.

14. A terminal, comprising:
a shell, defining a recess in a side of the shell;
a screen, embedded in the shell; and
a plug-in device received in the recess and comprising:
a circuit board,
a connecting piece stacked on the circuit board; and
a card tray stacked on the connecting piece, wherein the card tray comprises a first mounting face facing the connecting piece and a second mounting face away from the connecting piece, a side face of the card tray is provided with a groove; the first mounting face is configured to place a first chip card electrically connected to the circuit board through the connecting piece; and the second mounting face is configured to place a second chip card electrically connected to the circuit board; and
a housing fixed on the circuit board; wherein the card tray is arranged in the housing; an elastic piece extending along a direction in which the card tray is plugged in or pulled out the housing is provided on the housing, a protrusion is formed on the elastic piece;
wherein the protrusion is engaged in the groove to limit relative movement of the card tray and the housing.

15. The terminal according to claim 14, wherein a projection of the first mounting face along a direction perpendicular to the first mounting face overlaps that of the second mounting face.

16. The terminal according to claim 14, wherein an outer face of the card tray is flush with an outer face of the shell.

* * * * *